(12) United States Patent
Strandberg et al.

(10) Patent No.: US 6,872,589 B2
(45) Date of Patent: Mar. 29, 2005

(54) HIGH DENSITY CHIP LEVEL PACKAGE FOR THE PACKAGING OF INTEGRATED CIRCUITS AND METHOD TO MANUFACTURE SAME

(75) Inventors: Jan I. Strandberg, San Jose, CA (US); Richard Scott Trevino, San Jose, CA (US); Thomas B. Blount, San Jose, CA (US)

(73) Assignee: Kulicke & Soffa Investments, Inc., Wilmington, DE (US)

(*) Notice: Subject to any disclaimer, the term of this patent is extended or adjusted under 35 U.S.C. 154(b) by 0 days.

(21) Appl. No.: 10/360,845

(22) Filed: Feb. 6, 2003

(65) Prior Publication Data

US 2004/0155337 A1 Aug. 12, 2004

(51) Int. Cl.[7] .......................... H01L 21/44; H01L 21/48; H01L 21/50
(52) U.S. Cl. ........................................ 438/106; 438/108
(58) Field of Search ................................ 438/106, 108; 257/738, 778

(56) References Cited

U.S. PATENT DOCUMENTS

| | | |
|---|---|---|
| 4,854,038 A | 8/1989 | Wiley |
| 4,868,350 A | 9/1989 | Hoffarth et al. |
| 5,129,142 A | 7/1992 | Bindra et al. |
| 5,422,514 A | 6/1995 | Griswold et al. |
| 5,774,340 A | 6/1998 | Chang et al. |
| 5,796,164 A | 8/1998 | McGraw et al. |
| 5,998,859 A | 12/1999 | Griswold et al. |
| 2002/0001937 A1 | 1/2002 | Kikuchi et al. |
| 2003/0197285 A1 * | 10/2003 | Strandberg et al. ......... 257/778 |

* cited by examiner

Primary Examiner—Thien F Tran
(74) Attorney, Agent, or Firm—Townsend and Townsend and Crew LLP

(57) ABSTRACT

A package for mounting an integrated circuit die. In one embodiment the package comprises a metal substrate having first and second opposing primary surfaces and an aperture formed therebetween. A flexible thin film interconnect structure is formed over the first surface of the metal substrate and over the aperture. The flexible thin film interconnect structure has bottom and top opposing surfaces, a first region that is in direct contact with the first surface of the metal substrate and a second region that is opposite the aperture. The bottom surface of the thin film interconnect structure is in direct contact with the metal substrate in the first region. The thin film interconnect structure comprises (i) a first dielectric layer formed directly on the first surface of the metal substrate and extending over the aperture; (ii) a first metalization layer, formed over the first dielectric layer, comprising a plurality of signal lines positioned over the first region of the thin film interconnect structure and a first plurality of bonding pads positioned over the second region of the thin film interconnect structure; and (iii) a second plurality of bonding pads on the top surface of the thin film interconnect structure. The first plurality of bonding pads have a first pitch appropriate for attaching the integrated circuit die to the package and the second plurality of bonding pads have a pitch greater than the first pitch. Other embodiments of chip level packages as well as various methods for forming such packages are also disclosed.

15 Claims, 10 Drawing Sheets

HIGH DENSITY CHIP LEVEL PACKAGE FOR THE PACKAGING OF INTEGRATED CIRCUITS AND METHOD TO MANUFACTURE SAME

BACKGROUND OF THE INVENTION

The present invention relates to the packaging of integrated circuits. Some specific embodiments of the invention pertain to an integrated circuit (IC) package that has a metal substrate and a flexible thin film interconnect structure upon which the IC is mounted and a method for manufacturing the same.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch downward. The combination of these two trends has been a significant increase in the connector pin wiring density needed to connect the chips to packages that interface with the outside world and/or interconnect the chips to other integrated circuit devices.

One technology that has been used to meet such high density packaging demands combines flip chip and ball grid array (BGA) technologies to produce relatively small chip scale packages that have a relatively high lead count. According to one conventional method for creating flip chip BGA packages (FCBGA), a thin film interconnect structure is formed over one side of a laminate substrate, such as a printed circuit board (PCB), that has through holes that provide electrical connections from one side of the substrate to the other. A plurality of high density flip chip bonding pads are formed in the thin film interconnect structure and solder bumps are affixed to an integrated circuit which is then flipped upside down such that the solder bumps are brought into contact with their corresponding high density bonding pads. The solder balls are then reflowed to connect the integrated circuit to the thin film side of the PCB substrate.

Underfill, such as a thermo-set epoxy, is then dispensed in the gap between the integrated circuit and the substrate. The underfill is then cured by heating the substrate and integrated circuit to an appropriate curing temperature. Next, the assembly is cooled down and solder balls are attached to BGA bonding pads formed on the other side of the substrate to complete the packaging structure. Circuits connecting the BGA pads on the one side of the substrate to the high density flip chip pads (and therefore to the attached die) on the other side of the substrate are made through the plated through holes.

In order to achieve the high density interconnections desirable for some integrated circuit die packaging solutions, accurate registration of the photolithography involved in the formation of the thin film interconnect structure is critical. One problem with this conventional approach is that the laminate substrate over which the thin film layers are formed is subject to slight mechanical changes when subjected to humidity, different temperatures and other environmental factors. These slight mechanical changes may interfere with the accuracy of the thin film photolithography process thereby resulting in defective packaging structures.

NEC has researched and developed FCBGA technology that uses a metal substrate base instead of the traditional PCB laminate base. Using a metal substrate provides better registration accuracy than a traditional PCB or other type of laminate substrate which in turn enables very high density patterning steps to be more accurately used in the thin film interconnect structure formed over the substrate. According to NEC, their technology also is more cost effective than previously employed FCBGA technologies as fewer layers are fabricated and a smaller number of the fabricated layers need to be fine-pitch patterned.

FIGS. 1A–1G are simplified cross-sectional views of a packaging structure formed according to a first metal-substrate FCBGA process developed by NEC. This first NEC process forms a thin film interconnect structure over a metal substrate 10 of which only a portion is shown in FIGS. 1A–1G. The NEC engineers noted that substrate 10, which may be a stainless steel and copper alloy, should be an easily obtainable material that is suitable for manufacturing to high-tolerance flatness while also being strong enough to resist the pressure toward curvature that is exerted by a resin-film structure formed over the substrate.

As shown in FIG. 1A, the NEC process starts by forming a plurality of BGA pads 12 over metal substrate 10. BGA pads 12 are a three layer stack of gold (12a), nickel (12b) and copper (12c) as shown in FIG. 1B. Next, a thin film interconnect structure 14 is formed over the BGA pads (FIG. 1C). Interconnect structure 14 may include several thin film dielectric layers 16a, 16b and 16c as well as several thin film conductive layers 18a, 18b. Vias 20 interconnect various portions of layers 18a and 18b to each other and to BGA pads 12. Also formed on the upper surface of the thin film interconnect structure 14 are a plurality of flip chip pads 22 that enable bonding of an integrated circuit die 30 as shown in FIG. 1D.

IC die 30, of which only a portion is shown in FIGS. 1D–1G is attached to pads 22 using solder bumps 36. An underfill layer 34 is applied between the bottom of IC 30 and the top of thin film interconnect structure 14 in order to reduce the stress and fatigue on the solder balls during thermal cycling.

Referring to FIG. 1E, next a stiffener 38 and a lid 40 are added. In order for stiffener 38 to be adequately secured to the thin film interconnect structure 14 formed over substrate 10, a conductive adhesive (not shown) is applied between the stiffener and thin film structure at interface 39. Also, a thermal grease 42 may be placed over integrated circuit 30 before lid 40 is attached. After stiffener 38 and lid 40 are attached, metal substrate 10 is removed using a wet etch process to expose the BGA pads 12 as shown in FIG. 1F. Finally, the structure may be completed by attaching a heat spreader (not shown) to lid 40 and forming BGA solder balls 44 (shown in FIG. 1G) on pads 12 as appropriate.

FIGS. 2A and 2B are top and bottom perspective views, respectively, of the completed structure. For ease of illustration, a portion of lid 40 has been removed (shown in dotted lines) exposing integrated circuit die 30 and portions of stiffener 38. As shown in FIG. 2A, the packaging structure includes a central opening 50 in which die 30 is positioned. Also, the bottom surface of the structure includes a plurality of equally spaced solder balls 44 spaced apart from each other at an appropriate BGA-pitch.

While the above described process seems to be an improvement as compared to the conventional FCBGA technology described above. It suffers from a number of drawbacks. First, integrated circuit 30 is attached to thin film interconnect structure 14 before the thin film structure can be adequately tested for shorts using conventional electrical testing techniques, e.g., contact testing. This is because IC die 30 is attached prior to removing metal substrate 10 by the wet etch process. Forming thin film interconnect structure 14 over a conductive substrate, such as metal substrate 10, shorts the various circuits formed in the interconnect structure until the conductive substrate is removed. Thus, if a short or similar defect exists in thin film structure 14, integrated circuit 30, which may be quite expensive, may be lost resulting in a lower yield process unless specialized optical or other testing techniques are employed.

Another drawback with the above-described NEC approach is that it would most likely require that the ground reference plane for the interconnect package be formed in the relatively expensive thin film structure. While it is possible to use a metal stiffener 38 as the ground reference plane, all conductive adhesives known to the present inventors that may be used to attach the stiffener to thin film structure 14 would act as a high ohmic reference plane that would have a resistivity at least one or two orders of magnitude higher than copper. This approach would thus greatly slow down signals passing through the interconnect structure making it impractical for high speed devices.

NEC solved some of the above-noted problems when it developed technology described in U.S. Patent Application 2002/0001937 A1, which was published on Jan. 3, 2002 (hereinafter the "'1937 application"). A number of different processes for forming a semiconductor package board are described in the '1937 application. Each of these different processes uses a metal substrate similar to substrate 10 as a base for an overlying thin film interconnect structure. The interconnect structure includes a plurality of metal interconnect pads that are formed directly on the metal substrate. A central opening in the substrate is subsequently formed that exposes these metal interconnect pads for attachment to an integrated circuit that can be positioned within the central opening.

FIGS. 3A–3D are simplified cross-sectional views of a packaging structure formed according to one of the techniques described in the NEC '1937 application. Referring to FIG. 3A, the process starts by providing a metal substrate 60, which unlike the previously described NEC process, will become part of the final packaging product. A first set of bonding pads 62 is formed directly on substrate 60 and, as shown in FIG. 3B, a thin film interconnect structure 65 is formed over the substrate and over bonding pads 62.

Thin film interconnect structure 65 may include plural metal signal lines 64 separated by respective dielectric layers 63. A second set of bonding pads 66 is then formed over the top dielectric layer of thin film interconnect structure 64. The first set of bonding pads are ultimately connected to an integrated circuit die while the second set allow the die to be connected to the outside world through, for example, a BGA structure. Thus, second set of bonding pads 66 has a pitch that is greater than the pitch of first set of bonding pads 62.

Referring to FIG. 3C, a protective layer of photoresist 68 is then applied over the upper and lower surfaces of the structure and patterned on the lower surface to expose a central opening 70 of metal substrate 60 that is to be etched away. After a portion of substrate 60 is etched away to expose bonding pads 62, an integrated circuit die 72 can be positioned within opening 70 and connected to the first set of bonding pads as shown in FIG. 3D. A filler material such as filler 74 fills the space between die 72 and the packaging structure. Finally, BGA solder balls 76 are mounted to pads 66 formed on the upper surface of the structure.

FIGS. 4A and 4B show top and bottom perspective views, respectively, of the final packaging structure. As can be seen from a comparison of FIGS. 4A and 4B to FIGS. 2A and 2B, the final structure formed using this technique is very similar to the final structure formed from the earlier-described NEC technique even though the processes used to produce these structure are in themselves very different.

While the above described technique provides some improvement over the earlier described NEC technique, including the capability to test for short circuits prior to attaching a die, it is not without its own limitations. For example, while there are many different embodiments or variations of the above described technique set forth in the '1937 application, one element that each embodiment has in common is that the first set of bonding pads 62 (e.g., the flip chip pads) are formed directly on the surface of the metal substrate 60. This prevents forming signal lines in areas of the packaging structure outside the region designated for central opening 70 concurrent with the formation of pads 62 because any such signal lines formed directly on metal substrate 60 would be shorted together. Also, the etch step that removes metal substrate 60 in opening 70 may tend to undesirably etch pads 62 under some conditions. Additionally, the vertical sidewalls of pads 62 create areas of stress at corner regions 78 (shown in FIG. 3A) that may result in reliability problems under certain conditions.

Thus, while each of the NEC metal-substrate FCBGA processes described above represent improvements in some respects over previously known laminate-substrate FCBGA techniques, new and improved integrated circuit packaging techniques and structures are desirable.

BRIEF SUMMARY OF THE INVENTION

Some embodiments of the present invention pertain to packaging structures and semiconductor devices that include a metal substrate and a flexible, overlying thin film interconnect structure. The packaging structure can be tested for both shorts and opens in the thin film interconnect structure using standard testing techniques prior to attaching an integrated circuit die to the thin film interconnect structure. In some specific embodiments, the packaging structure includes a dielectric layer that is formed directly on the metal substrate and a first layer of metalization that is formed over the dielectric layer. This allows the first layer of metalization to be used to form both bonding pads suitable for bonding an integrated circuit die to the package and signal lines. Also, in some specific embodiments, the dielectric layer covers a portion of the periphery of the IC die bonding pads thus reducing stress associated with the structure.

Other embodiments of the invention pertain to methods of forming a chip level package that use a metal substrate as a base for an overlying thin film interconnect structure. These methods enable testing for both shorts and opens in the thin film interconnect structure using standard testing techniques prior to attaching a die to the thin film interconnect structure. In some specific embodiments, the first layer of metalization is formed over a dielectric layer formed directly on the metal substrate. This allows the first layer of metalization to be used to form both bonding pads suitable for bonding an integrated circuit die to the package and signal lines. Also, in some specific embodiments, the outer peripheral edges of the IC die bonding pads are covered by the dielectric layer when the pads are exposed for bonding. This reduces stress associated with the structure.

According to one embodiment of the present invention, a integrated circuit package is provided that comprises a metal substrate having first and second opposing primary surfaces and an aperture formed therebetween. A flexible thin film interconnect structure is formed over the first surface of the metal substrate and over the aperture. The flexible thin film interconnect structure has bottom and top opposing surfaces, a first region that is in direct contact with the first surface of the metal substrate and a second region that is opposite the aperture. The bottom surface of the thin film interconnect structure is in direct contact with the metal substrate in the first region. The thin film interconnect structure comprises (i) a first dielectric layer formed directly on the first surface of the metal substrate and extending over the aperture; (ii) a first metalization layer, formed over the first dielectric layer, comprising a plurality of signal lines positioned over the first region of the thin film interconnect structure and a first plurality of bonding pads positioned over the second region of the thin film interconnect structure; and (iii) a second plurality of bonding pads on the top surface of the thin film interconnect structure. The first plurality of bonding pads have a first pitch appropriate for attaching the integrated circuit die to the package and the second plurality of bonding pads have a pitch greater than the first pitch. In some specific embodiments the first plurality of bonding pads are flip chip pads and the second plurality of bonding pads are BGA pads. Also, in some specific embodiments, the first dielectric layer has an elongation percentage of at least 30 percent.

According to one embodiment of the method of the present invention, an integrated circuit package is formed by forming a thin film dielectric layer directly on a metal substrate and forming a first metallization layer over the thin film dielectric layer where the first metallization layer includes a first plurality bonding pads formed over a first region of the substrate and a plurality of signal lines formed over a second region of the substrate. Additional layers of a thin film interconnect structure are further formed over the substrate including a second dielectric layer and a second metalization layer including a second plurality of bonding pads that have a pitch greater than a pitch of the first plurality of bonding pads. A portion of the metal substrate in the first region opposite the first plurality of bonding pads is removed forming an aperture between the first and second opposing surfaces of the metal substrate and an integrated circuit die is positioned in the aperture and attached to the first plurality of bonding pads.

These and other embodiments of the invention, as well as its features and some potential advantages, are described in more detail in conjunction with the text below and attached figures, none of which are drawn to scale.

DETAILED DESCRIPTION OF THE INVENTION

As previously stated, some embodiments of the present invention pertain to methods of forming an integrated circuit package that uses a metal substrate as a base upon which overlying thin film interconnect layers are formed. Unlike the first NEC technique described above, methods of the invention enable testing of the thin film interconnect structure for both shorts and opens using standard electrical testing techniques prior to attaching a die to the thin film interconnect structure. Also, unlike the NEC techniques described in the '1937 application, embodiments of the invention allow the first layer of metalization to be used for both pads to connect the package to an integrated circuit die and for signal lines.

In order to better appreciate and understand the present invention, reference is made below to FIG. 5, which is a flow chart illustrating the steps associated with fabricating a chip level package according to one embodiment of the invention, and FIGS. 6A–6I, which are simplified cross-sectional views of a chip level package structure at various stages of formation set forth in the flowchart of FIG. 5.

Figure 1A:
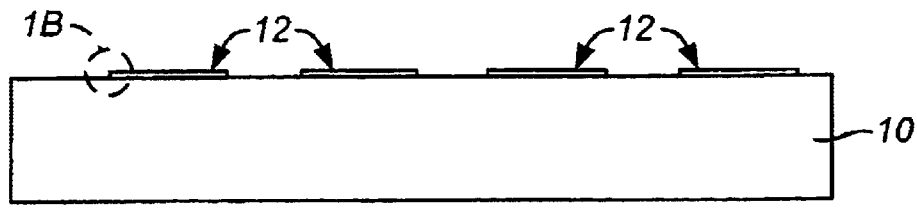
FIGS. 1A–1G are simplified cross sectional views of a packaging structure formed according to one previously known technique.
Figure 1B:
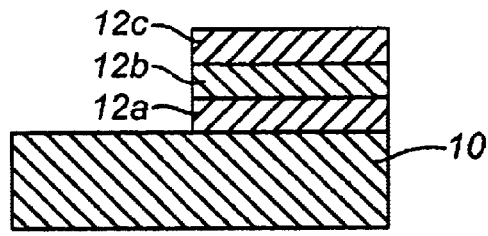
Figure 1C:
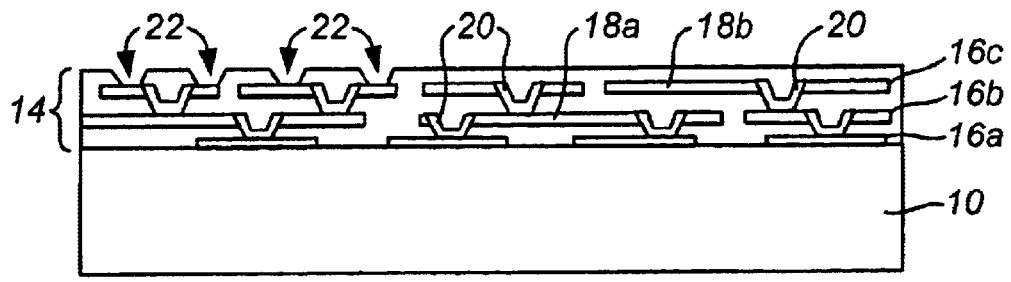
Figure 1D:
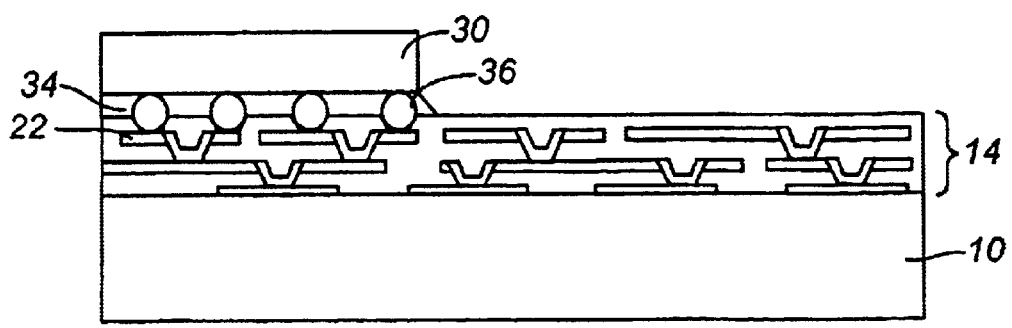
Figure 1E:
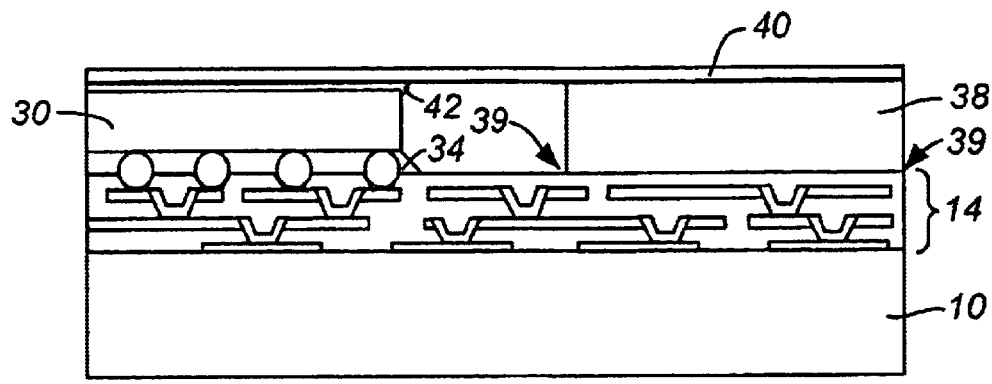
Figure 1F:
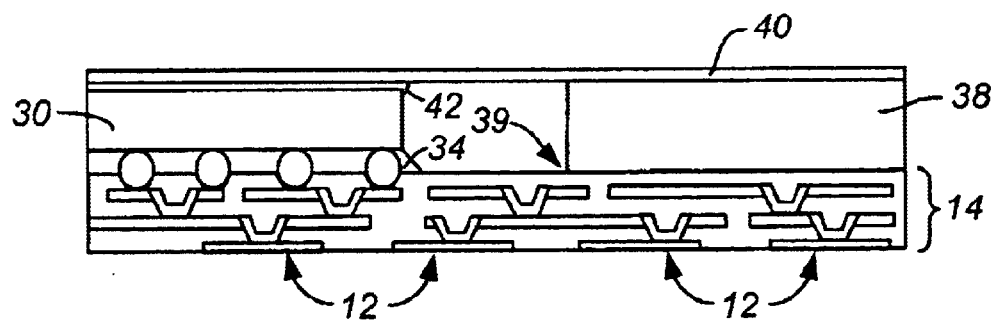
Figure 1G:
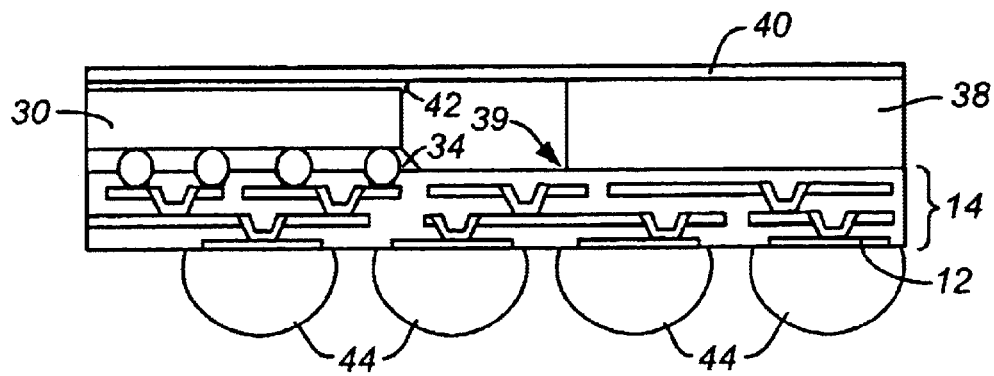
Figure 2A:
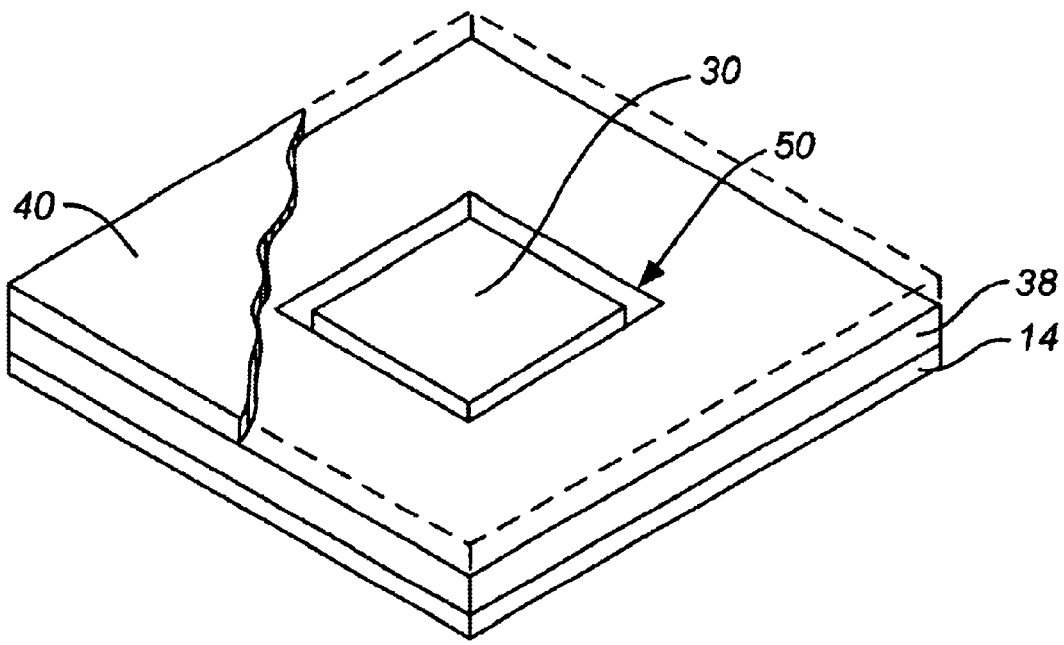
FIGS. 2A and 2B are top and bottom perspective views, respectively, of the packaging structure formed according to the technique discussed with respect to FIGS. 1A–1G.
Figure 2B:
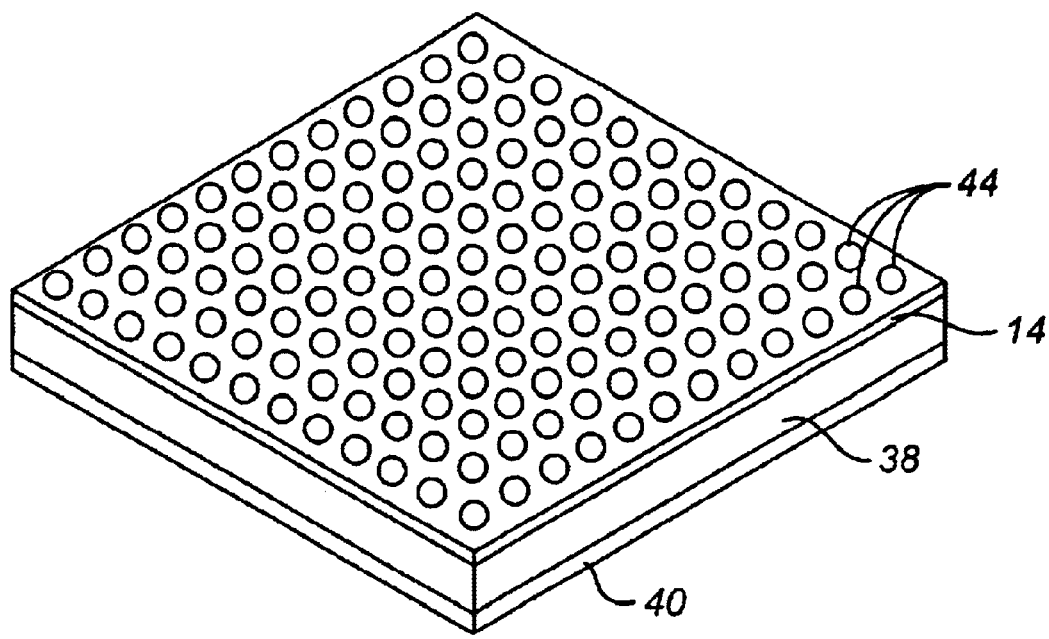
Figure 3A:
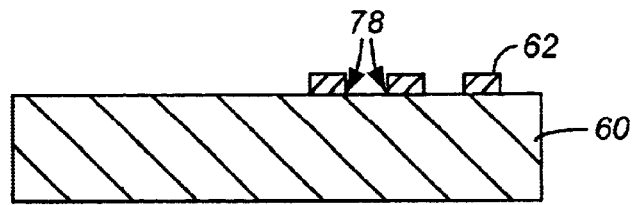
FIGS. 3A–3D are simplified cross sectional views of a packaging structure formed according to another previously known technique.
Figure 3B:
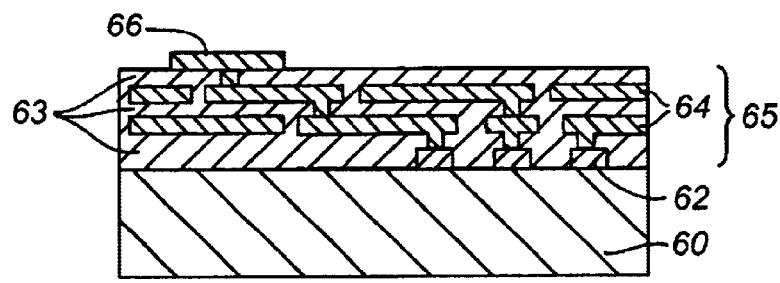
Figure 3C:
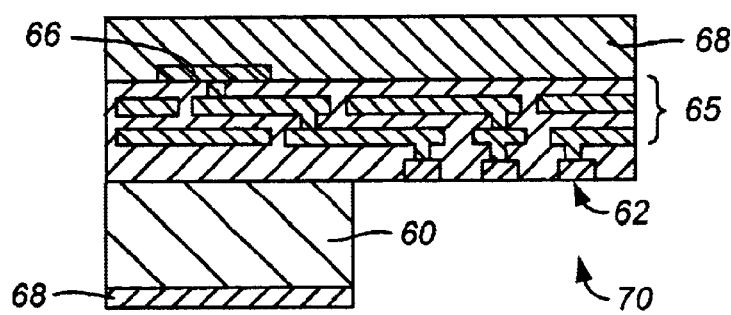
Figure 3D:
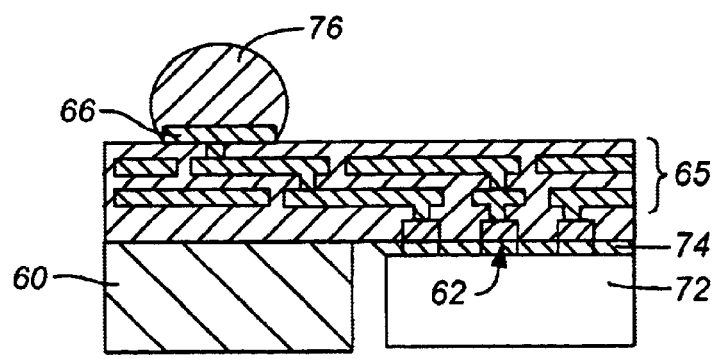
Figure 4A:
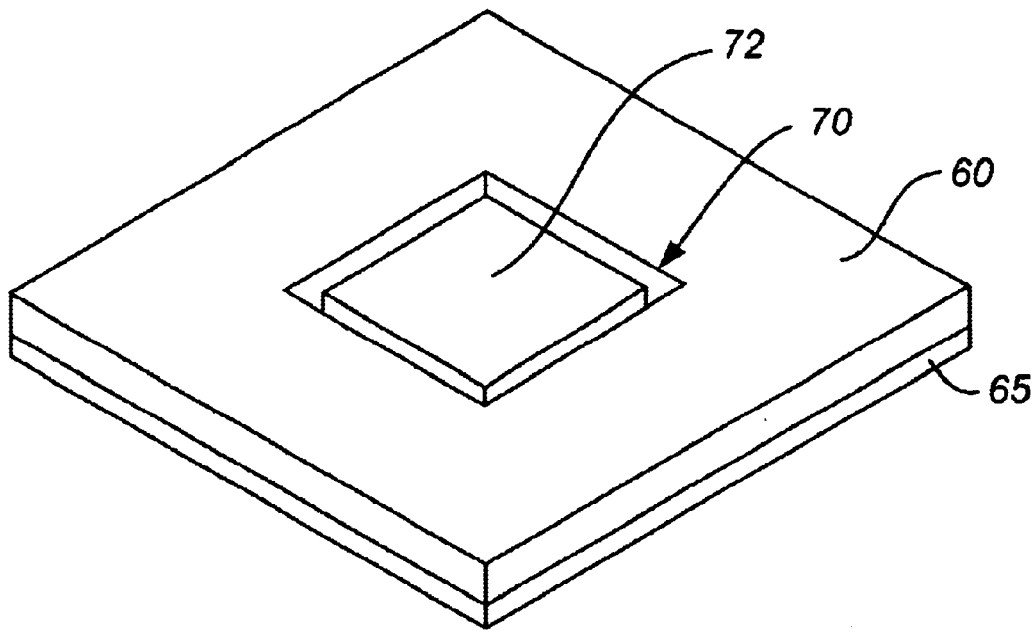
FIGS. 4A and 4B are top and bottom perspective views, respectively, of the packaging structure formed according to the technique discussed with respect to FIGS. 3A–3D.
Figure 4B:
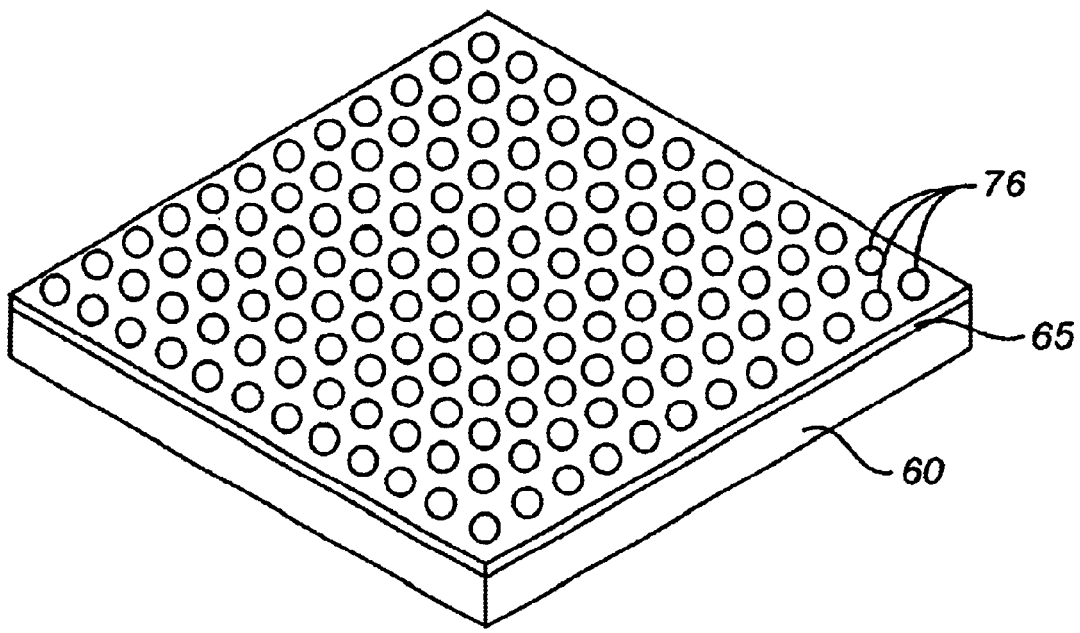
Figure 5:
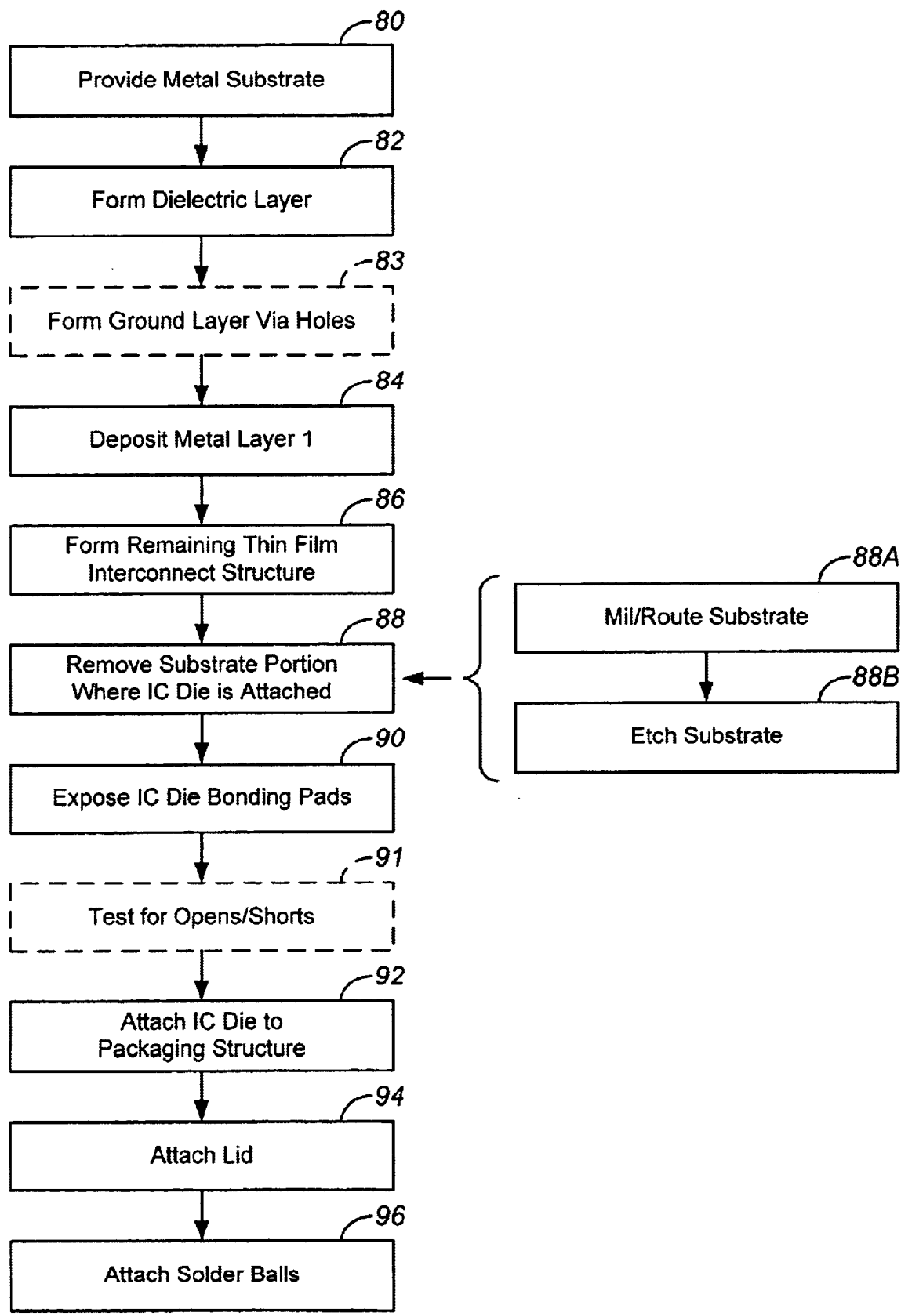
FIG. 5 is a flow chart illustrating the steps associated with fabricating a packaging structure according to one embodiment of the present invention.
Figure 6A:
FIGS. 6A–6I are simplified cross sectional views of a packaging structure formed according to the process set forth in FIG. 5.
Figure 6B:
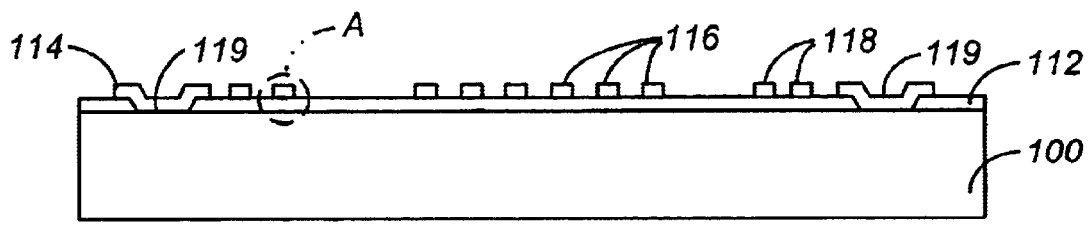

Referring to FIG. 5 and FIG. 6A, the method starts by providing a metal substrate 110 (FIG. 5, step 80), which will be part of a final packaging structure 100 that is to be formed. In one embodiment substrate 110 is a copper substrate but in other embodiments substrate 110 can be made from any appropriate metal material that can be milled and/or etched to form an aperture in which an integrated circuit die can be positioned as discussed below. Substrate 110 can be any appropriate thickness. In some embodiments, substrate 110 is ground in step 50 to a thickness that is approximately equal to the thickness of the silicon die to be packaged on substrate 110 combined with the die's associated bonding pads and solder bumps (bump height). In one example, substrate 110 may be purchased as a copper plate from an appropriate materials supply company to have an initial thickness of 800±25 microns and be ground to a thickness of 600 microns in step 80. Step 80 may also include cleaning the metal substrate to remove grease and/or other contaminants and oxidizing or roughening the surface to improve the adhesion of layers subsequently formed over the substrate.

Next, a dielectric layer 112 is formed on substrate 110 (FIG. 5, step 82). Dielectric layer 112 can be formed using any known film deposition technique including, for example, chemical vapor deposition, spin-on techniques or spray coating. In one embodiment, dielectric layer 112 is a polymer material that has a relatively high elongation percentage (e.g., over 30 percent). An example of such a polyimide is a polybenzoxasole (PBO) material deposited using well known spin-on dielectric techniques.

Figure 6C:
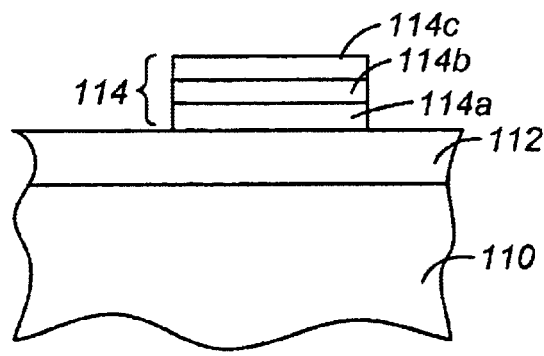

After formation of dielectric layer 112, a first layer of metal 114 is formed over the dielectric layer (FIG. 5, step 84). Referring to FIG. 6C, in one particular embodiment metal layer 114 is a three layer structure that includes a bottom layer 114a of gold, a middle nickel layer 114b and an upper copper layer 114c. Referring back to FIG. 6B, metal layer 114 includes both a plurality of flip chip pads 116 and a plurality of signal lines 118. As explained in more detail below, flip chip pads 116 will subsequently be used to attach an integrated circuit die to the packaging structure. To this end, flip chip pads 116 are formed in a region of the packaging structure in which an aperture in the metal substrate will be subsequently opened. Signal lines 118, on the other hand, are formed in areas of the structure that will not be subsequently exposed.

Figure 7A:
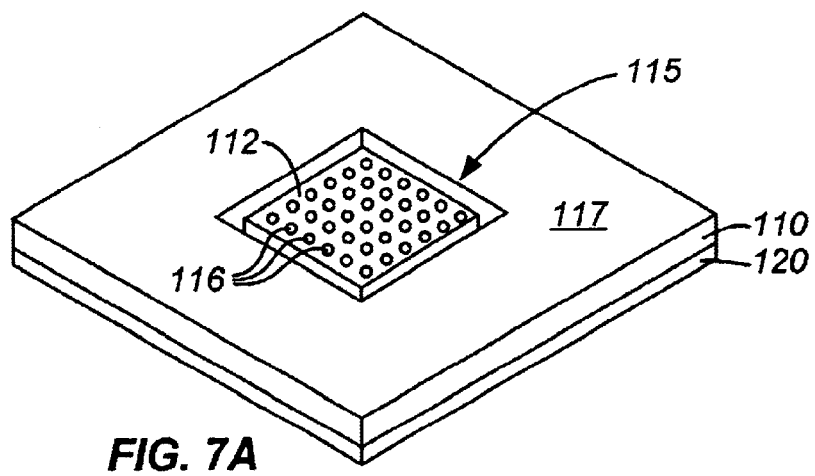
FIG. 7A is a simplified top perspective view of packaging structure 100 shown in FIGS. 6A–6I before integrated circuit 150 is attached to the structure.

Referring to FIG. 7A, which is a simplified perspective view of substrate 110, pads 116 are formed over a region 115 of substrate 110 that is subsequently etched away in step 88 so that an integrated circuit die can be attached to the pads. In one embodiment pads 116 and signal lines 118 (not shown in FIG. 7A because they are covered by both metal substrate 110 and dielectric layer 112) are formed by depositing and patterning an appropriate photoresist material over substrate 110 and then plating one or more layers of metal over the substrate by applying a plating current to the substrate as is known to those of skill in the art. After the pads are formed, the photoresist material is removed using well known photoresist stripping techniques.

Pads 116 may be subsequently used to attach a silicon die or other type of integrated circuit die to the packaging structure. Accordingly, in some embodiments pads 116 are spaced at an IC-pitch of, for example, 150–250 microns. Also, in some embodiments the width of pads 116 is about 40–50% of the pitch.

Figure 6D:
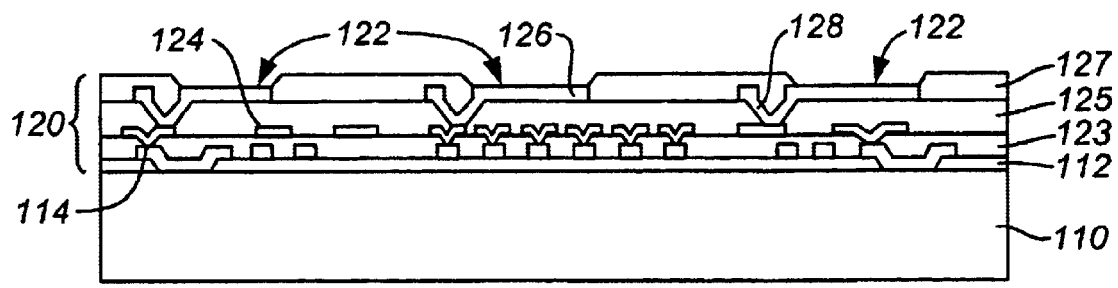

Referring to FIG. 6D, next the remainder of a thin film interconnect structure 120 is formed over substrate 110 (FIG. 5, step 86). Thin film interconnect structure 120 may include alternating dielectric and conductive layers as appropriate to route signal paths and other lines over the packaging structure. Also formed on the top surface of thin film interconnect structure 120 are pads 122, which are spaced at a pitch greater than the pitch of pads 116. In one specific embodiment pads 122 are spaced at a package-pitch for component level connections using, for example, BGA solder bumps. The spacing of such BGA level pads is considerably less dense than the spacing of the die level pads. For example, BGA pads are typically spaced at a package-pitch of, for example, 0.5–1.0 mm. Also, the width of such package-pitched pads is typically about 50–60% of their pitch.

The number of layers in interconnect structure 120, which includes first dielectric layer 112 and first metal layer 114, will depend on the application. As an example, packaging structure 100 shown in FIG. 6D includes three signal layers, metal layers 114, 124 and 126. Metal layer 124 is separated from metal layer 114 by a thin film dielectric layer 123; metal layers 124 and 126 are separated from each other by a thin film dielectric layer 125 and a thin film dielectric layer 127 covers metal layer 126 except in the areas where pads 122 are formed. Vias 128 are formed between the various thin film conductive layers 114, 124 and 126. Other embodiments of the invention may include fewer or more signal lines and corresponding dielectric insulating layers separating such lines.

According to one embodiment of the invention, thin film interconnect structure 120 is a flexible structure after curing. As used herein, being "flexible" means, when separated from substrate 110, interconnect structure 120 can be bent up and down like a piece of copper foil or Scotch tape without much effort. In contrast, a rigid layer, such as a relatively thick metal plate, cannot be readily bent without the use of considerable force. As will be discussed in more detail below, subsequent processing to packaging structure 100 removes all of substrate 110 in the area 115 where an integrated circuit die is to be attached to pads 116. Thus, at that stage of processing, the portion of interconnect structure 120 above area 115 is left unsupported except to the extent that portions of the structure are attached to regions 117 of substrate 110 adjacent to region 115.

In some embodiments of the invention, interconnect structure 120 is made flexible by using a polymer material that has a relatively high elongation percentage (e.g., over 30 percent) for one or more of the individual dielectric layer(s) within the thin film interconnect structure. In some embodiments, each dielectric layer within the thin film interconnect structure has an elongation percentage of 30 percent or higher. In one particular embodiment, the dielectric layers within interconnect structure 120 have an elongation percentage of between about 40–50 percent.

In some embodiments, the dielectric layers in thin film interconnect structure 120 are formed from a photosensitive polyamide material thereby allowing the formation of vias within the layers using standard photolithography techniques without a special photomask layer. In other embodiments, however, the thin film dielectric layers are a laser ablatable material and the vias may be formed using laser ablation techniques.

Other desirable properties for the thin film dielectric layers according to some embodiments of the invention include a glass transition temperature above 260° C. (the temperature that certain lead-free solder bumps that may be desirable to use are reflowed at as discussed more below), a total halogen content of less than 10 ppm and a tensile strength of at least 100 MPa. One example of a suitable polymer material for layers 123, 125 and 127 is CRC-8000 available from Sumitomo Bakelite. CRC-8000 is a polybenzoxasole (PBO) material that is a positive acting, photosensitive polymer. Depending on the material used, certain embodiments of the invention develop and pattern the material after it is deposited and then subsequently cure the material to cross links the polymers and improve the layer's mechanical strength.

In other embodiments, other appropriate elastic polyamides, epoxy-based resins and/or other materials may be used as dielectric layers in the thin film structure. In one embodiment the thin film dielectric layers are formed using a standard spin-on process, while other embodiments may apply the material using spray coating, extrusion or any other appropriate technique for the selected material. Conductive layers 124 and 126 may be formed from any appropriate metal using any appropriate deposition technique. In one example, layers 124 and 126 are copper layers that are formed by an electroplating process. In some embodiments, layers 124 and 126 include multiple layers such as a seed layer and/or a barrier layer.

Figure 6E:
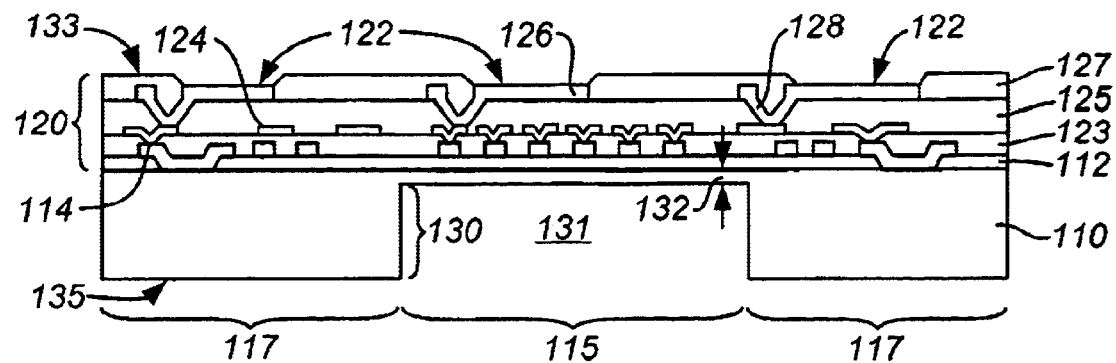
Figure 6F:
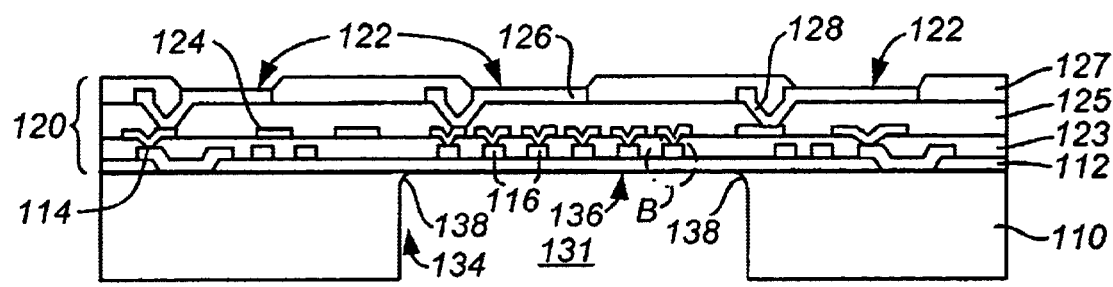

After the thin film interconnect structure is formed, a portion of substrate 110 is removed forming an aperture or cavity 131 in region 115. Aperture 131 exposes pads 116 as shown in FIGS. 6E and 6F (FIG. 5, step 88). In one embodiment the removal of the portion of substrate 110 thereby forming aperture 115 is a two step process where a first thickness of the substrate is removed in a milling operation (step 88a) and a second thickness is removed in a wet etch process (step 88b). Such an embodiment is illustrated in FIGS. 6E and 6F. As can be seen in FIG. 6E, milling step 88a may remove a majority of the substrate (thickness 130) in region 115 leaving a relatively thin (e.g., 50–150 micron) layer. The remaining thickness 132 of the substrate in area 115 can then be removed in a wet etch process creating the structure 100 that includes the aperture 131 where the substrate was removed as shown in FIG. 6F. In one embodiment, aperture 115 is shaped similarly to the integrated circuit die that will be subsequently placed within the aperture and attached to interconnect layer 120.

One benefit achieved in some embodiments of the invention is that the wet etching process that removes final thickness 132 of substrate 110 etches material less effectively in the corner areas 134 of the substrate than the flat surface 136. Accordingly, an angled or curved interface 138 may be formed in the corner areas. Such an angled or curved surface serves to reduce stress between the thin film interconnect structure 120 and the remaining portion of substrate 110. Embodiments of the invention that employ such a wet etch technique typically cover the upper surface 133 of the packaging structure, and optionally, the lower surface 135 of metal substrate 110 in region 117 with an appropriate photoresist material (not shown) in order to protect those surfaces including the pads formed on surface 133 from exposure to the etchant chemicals.

Figure 6G:
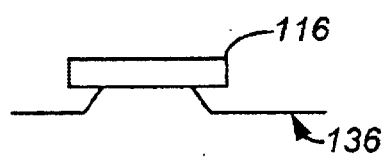

Even after cavity 131 has been milled and/or etched out of metal substrate 110, bonding pads 116 are still not exposed for bonding to an integrated circuit. Accordingly, embodiments of the invention include a bonding pad exposure step (FIG. 5, step 90) that removes portions of dielectric layer 112 in areas corresponding to the bonding pads as is shown in FIG. 6G. One method for removing portions of the dielectric layer is using laser ablation technology as would be understood by a person of skill in the art. Other embodiments remove selected portions of dielectric layer 112 in areas corresponding to the bonding pads using photolithographic or other appropriate techniques. If dielectric layer 112 is a photosensitive layer, such photolithographic techniques can be employed without forming a separate photoresist layer over the exposed surface of dielectric layer 112.

As shown in FIG. 6G, some embodiments of the invention only remove a portion of dielectric layer 112 over a central portion of pads 116 thus leaving the outer periphery of the pads covered by the dielectric material. Such a technique leaves polyimide material under the corners of the pads adding strength to their design so that they are better able to withstand stress associated with subsequent processing steps such as the bonding of an integrated circuit to the pads.

Figure 6H:
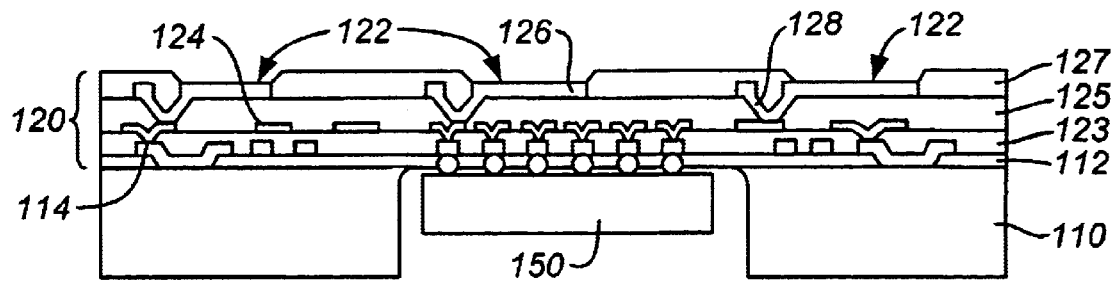

Referring to FIG. 6H, next an integrated circuit die 150 is attached to bonding pads 116 in cavity 132 using a suitable process, such as flip chip bonding (FIG. 5, step 92). The flip chip or other bonding process will often result in a pressure being applied against the thin film interconnect structure 120. Such pressure may tend to distort and/or stretch the interconnect structure, which in some embodiments is less than 100 microns thick. The flexibility of structure 120, however, helps it withstand such forces.

Optionally, an underfill resin 152 may be arranged between die 150 and thin film interconnect structure 120 to improve mounting reliability. When a flip chip bonding technique is used on a rigid substrate, such an underfill resin may help relieve stress and fatigue between the bumps and die associated with the various thermal cycles the packaging structure is subjected to. In embodiments of the invention, such an underfill resin is optional as the relatively high flexibility of the interconnect structure should reduce such stress and fatigue to manageable levels in many embodiments. In certain embodiments of the invention the underfill resin may be useful, however, to protect the die surface from ionic and/or other contamination.

Figure 6I:
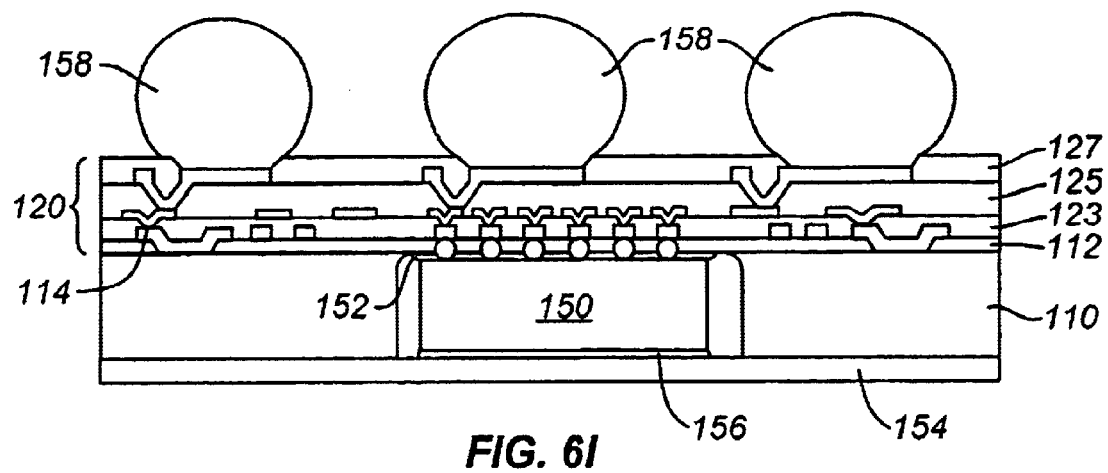
Figure 7B:
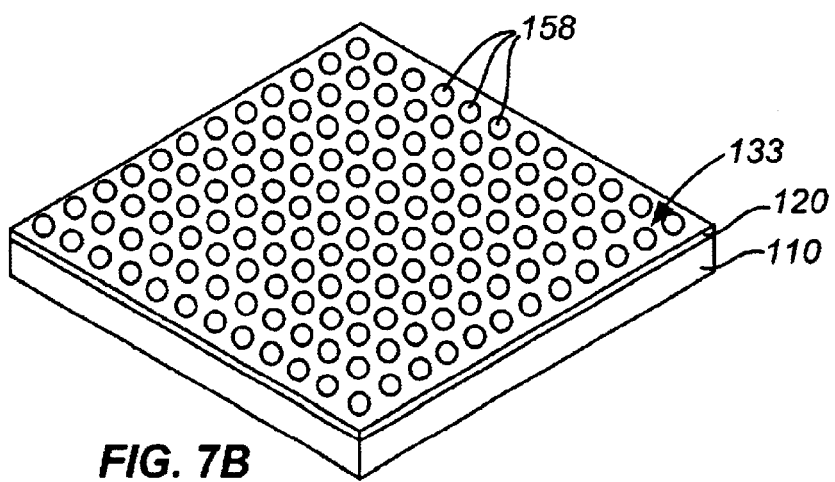
FIG. 7B is a simplified bottom perspective view of packaging structure 100 shown in FIGS. 6A–6I after BGA bumps 158 have been formed on the structure.

After die 150 is attached, an optional lid 156 is placed over the die and substrate (FIG. 5, step 94) and solder bumps 158 or other appropriate bumps are formed on exposed pads 122 on the side of the thin film interconnect structure opposite that of die 130 as shown in FIG. 6I (FIG. 5, step 96). FIG. 7B shows a simplified bottom perspective view of packaging structure 100 having BGA bumps 158 formed on surface 133.

In one embodiment lid 154 is attached to the packaging structure prior to bumps 158 but this is not necessary in other embodiments. Lid 154 is typically a metal lid, e.g., copper, that helps with heat dissipation. Fins (not shown) may be attached to lid 154 to further dissipate heat as appropriate. Also, a thermal grease 156 may be applied to integrated circuit die 150 to help facilitate heat transfer from die 150 to the lid.

Figure 8A:
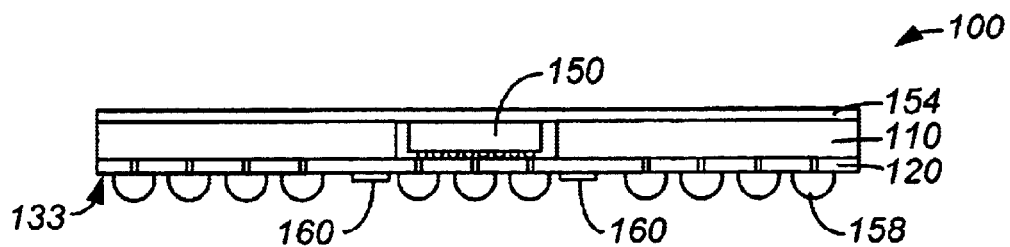
FIGS. 8A–8C are simplified cross-sectional views of packaging structures that may be formed according to some embodiments of the present invention.
Figure 8B:
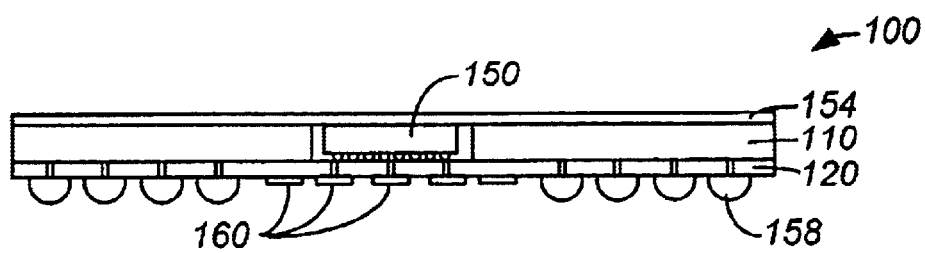

FIG. 8A shows one example of a final chip level package 100 produced by the method depicted in FIG. 5. As shown in FIG. 8A, BGA bumps 158 formed on surface 133 of package 100 can be used to connect integrated circuit die 150 to passive components and/or various electronic structures. Also, in some area capacitors 160 and/or other passive components may be formed directly over the BGA pads. FIG. 8B shows that capacitors 160 may be formed over pads 122 so that they are spaced from die 150 by a distance that is approximately equal to the combined thickness of thin film interconnect structure 120 and the flip chip bumps. Such relatively close spacing of the capacitors to the die may reduce the inductance between the die and the capacitors thereby improving the performance (e.g., speed) and efficiency of the package. The lower inductance levels that are achievable using such a design may also lead to fewer capacitors being necessary than if the capacitors were spaced one or more millimeters from the die as is necessary in some previously known FCBGA packages.

In one embodiment of the invention, steps 80 to 86 discussed above are performed at a first location, such as the fabrication facility owned by a manufacturer of chip level packaging structures, and steps 88 to 96 are performed at one or more other locations, such as the semiconductor assembly facility. In another embodiment, the thin film interconnect structure 120 formed over substrate 110 is tested for both open circuits and short circuits using a standard testing procedure such as contact testing between steps 90 and 92 (shown as step 91 in FIG. 5). The testing of step 91 can be done at the chip level package fabrication facility, at the assembly facility or both. Step 91 is able to test for both open and short circuits prior to the attachment of die 150 by probing appropriate ones of pads 116 and 122 because all of substrate 110 was milled and/or etched away in the area 115 where pads 116 are formed. Accordingly, the method of the present invention can avoid the costly mistake of attaching a good die to a defective thin film interconnect structure and thus help improve a manufacturer's yield.

Embodiments of the invention also allow for the use of various lead-free bumps to attach die 150 to substrate 110 and to attach the BGA balls. The reflow temperature for some of these lead-free bumps, which may be made from, for example, an alloy of tin, copper and silver may be above 260° C. It is generally undesirable to heat traditional PCB material to temperatures this high as water molecules absorbed in the laminate structure, underfill material or thin film dielectric layers may cause defects in the laminate material. Metal substrate 110 can readily be heated to temperatures of 260° C. or higher, however.

Also, in some embodiments of the chip level packaging structure of the present invention, substrate 110 may be used as a ground reference plane for packaging structure because thin film interconnect 120 is formed directly on substrate 110 without an intervening adhesive layer. In such a structure, vias (shown as vias 119 in FIGS. 6B–6I) through dielectric layer 112 may be formed in region 117 of substrate 110 which is not removed during step 88. Such vias, which allow direct contact to substrate 110 when they are filled with metal in step 84, can be formed in an optional step 83 (FIG. 5) after the formation of dielectric layer 112 and before the formation of metal layer 114. Circuits within the thin film interconnect structure 120 may route the ground signal from substrate 110 through the contact pads to other parts of the interconnect structure 120 and to BGA pads 122 as appropriate. Using substrate 110 as the ground reference plane enables the formation of one less thin film layer than structures that form the ground reference plane in the thin film interconnect portion of the packaging structure.

Figure 9:
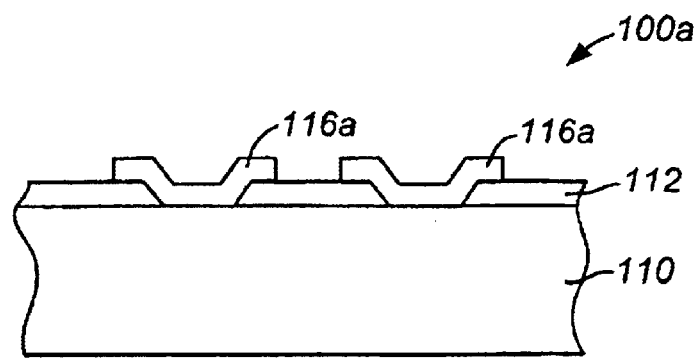
FIG. 9 is a simplified cross-sectional view of a portion of a packaging structure formed according to another embodiment of the present invention.

In other embodiments of the invention, bonding pads 116 may be formed on metal substrate 110 in the following manner. After dielectric layer 112 is formed, the layer is patterned using photolithographic or other patterning techniques to each a plurality of holes in layer 112 above region 115 of the substrate. These holes can be formed in the same step used to form contacts 119 to the substrate in region 117. Each hole is then subsequently filled with metal when metal layer 114 is deposited forming a plurality of bonding pads 116a as shown in FIG. 9, which is a simplified cross-sectional view of a portion of a packaging structure 100a formed according to this technique. This technique has the benefit of not requiring step 90 to expose the bonding pads for attachment of die 150. It also results in the formation of bonding pads 116a that do not suffer from the same sort of stress issues at the corners of the pad as was discussed with respect to the NEC technique illustrated in FIGS. 3A–3D. This technique does require, however, careful control over the process used to remove substrate 110 to form aperture 131 so that pads 116a are not damaged.

Figure 8C:
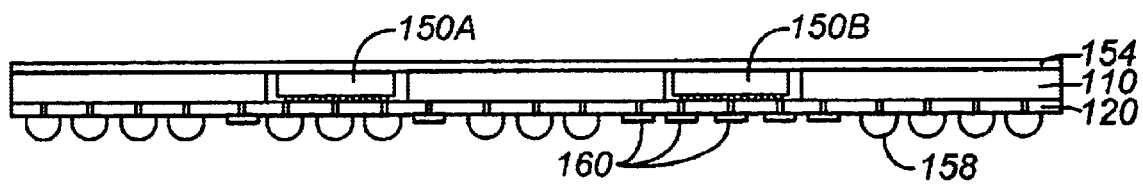

The description above is intended to help illustrate the principles of this invention and is not intended to limit the scope of this invention in any way. Also, while the invention has been described with reference to a specific example thereof, it will be apparent to a person of ordinary skill in the art that various changes and modifications can be made to the concepts presented herein without departing from the spirit and scope of the invention. For example, while the invention was described with respect to removing a single portion of substrate 110 in which a single integrated circuit die can be attached, multiple portions of the substrate can be removed to attach multiple die 150a and 150b as shown in FIG. 8C. These equivalents and alternatives are intended to be included within the scope of the present invention.

What is claimed is:

1. A method of forming a chip level package, said method comprising:

forming a thin film interconnect structure over a metal substrate having first and second opposing surfaces, the thin film interconnect structure comprising a first dielectric layer formed directly on the first surface of the metal substrate, a first metalization layer formed over the first dielectric layer, said first metalization layer including a first plurality bonding pads formed over a first region of the substrate and a plurality of signal lines formed over a second region of the substrate, a second dielectric layer formed over the first metalization layer and a second metalization layer including a second plurality of bonding pads, wherein the second plurality of bonding pads have a pitch that is greater than a pitch of the first plurality of bonding pads;

forming an aperture between the first and second surfaces of the metal substrate in said first region opposite the first plurality of bonding pads; and positioning an integrated circuit die in the aperture and attaching the die to the first plurality of bonding pads.

2. The method of claim 1 wherein the first plurality of bonding pads are flip chip pads.

3. The method of claim 1 wherein the second plurality of bonding pads are BGA pads.

4. The method of claim 1 wherein the portion of the metal substrate is removed in a multistep process that comprises milling a first thickness of the metal substrate in the first region and etching the remaining thickness of the metal substrate in a wet etching process to expose the first plurality of bonding pads.

5. The method of claim 1 further comprising soldering ball grid array bumps to the second plurality of bonding pads on an exposed surface of the thin film interconnect structure.

6. The method of claim 1 wherein a plurality of surface mount components are attached to selected ones of the second plurality of bonding pads.

7. The method of claim 1 further comprising, after opening the aperture between the first and second opposing surfaces of the metal substrate, removing a portion of the first dielectric layer to expose the first plurality of bonding pads.

8. The method of claim 7 wherein the removing a portion of the first dielectric layer step comprises exposing the first plurality of bonding pads using a laser ablation technique.

9. The method of claim 1 wherein the thin film interconnect structure is a flexible structure that comprises a plurality of thin film metal layers and a plurality of thin film dielectric layers.

10. The method of claim 9 wherein the thin film interconnect structure has a thickness of between 30 and 70 microns.

11. The method of claim 1 wherein the first plurality of bonding pads are flip chip pads and the second plurality of bonding pads are BGA pads.

12. The method of claim 11 further comprising attaching a lid over the integrated circuit die and the second region of the metal substrate.

13. The method of claim 11 further comprising one or more additional pairs of thin film metalization and thin film dielectric layers between the second dielectric layer and the second metalization layer.

14. The method of claim 11 wherein the thin film dielectric layers in the thin film interconnect structure have an elongation percentage of at least 30 percent.

15. The method of claim 14 wherein the thin film dielectric layers in the thin film interconnect structure have an elongation percentage of between 40–50 percent.

* * * * *